(12) United States Patent
Nguyen et al.

(10) Patent No.: US 6,842,043 B1
(45) Date of Patent: Jan. 11, 2005

(54) HIGH-SPEED, LOW CURRENT LEVEL SHIFTER CIRCUITS FOR INTEGRATED CIRCUITS HAVING MULTIPLE POWER SUPPLIES

(75) Inventors: Andy T. Nguyen, San Jose, CA (US); Shi-dong Zhou, Milpitas, CA (US); Ronald L. Cline, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 64 days.

(21) Appl. No.: 10/386,993

(22) Filed: Mar. 11, 2003

(51) Int. Cl.[7] .......................................... H03K 19/0175
(52) U.S. Cl. .............................. 326/68; 326/70; 326/83
(58) Field of Search ............................... 326/63, 68–71, 326/73, 74, 83

(56) References Cited

U.S. PATENT DOCUMENTS

| | | |
|---|---|---|
| 4,978,870 A | 12/1990 | Chen et al. |
| 5,223,751 A | 6/1993 | Simmons et al. |
| 5,574,389 A | 11/1996 | Chu |
| 5,659,258 A | 8/1997 | Tanabe et al. |
| 5,680,064 A | 10/1997 | Masaki et al. |
| 6,054,875 A | 4/2000 | Wayner |
| 6,232,818 B1 | 5/2001 | Zaliznyak |
| 6,456,110 B1 * | 9/2002 | Elamanchili et al. ......... 326/68 |
| 6,487,687 B1 * | 11/2002 | Blake et al. ................. 714/724 |

* cited by examiner

Primary Examiner—Don Le
(74) Attorney, Agent, or Firm—Lois D. Cartier

(57) ABSTRACT

Level shifter circuits that provide fast operation when changing state while generating little crowbar current. Various embodiments are presented that include some of the following features added to conventional level shifters: additional pull-down transistors coupled to each output node and gated by the associated input signal; additional pull-up transistors coupled to each output node or cross-coupled internal node and gated by the associated input signal; additional pull-up transistors coupled to the cross-coupled internal nodes and gated by the opposing output node; and additional pull-down transistors on the output nodes gated by a low voltage power high. Some of these additional transistors allow the input signal to operate more quickly on the output nodes, causing more rapid transitions on the output signals and reducing crowbar current. The pull-downs gated by the low voltage power high ensure that little or no crowbar current occurs during the power-up sequence.

44 Claims, 10 Drawing Sheets

US 6,842,043 B1

HIGH-SPEED, LOW CURRENT LEVEL SHIFTER CIRCUITS FOR INTEGRATED CIRCUITS HAVING MULTIPLE POWER SUPPLIES

FIELD OF THE INVENTION

The invention relates to integrated circuits (ICs). More particularly, the invention relates to level shifter circuits for ICs.

BACKGROUND OF THE INVENTION

Integrated circuits (ICs) frequently include circuits that operate at different power high levels. For example, input/output (I/O) circuits frequently operate at a higher voltage than circuits in the interior (core) of the I/C. A higher voltage can be desirable at the I/O pads, for example, to interface properly with other ICs operating at a higher voltage, and to drive the heavily loaded output signals at an acceptable speed. A lower voltage can be desirable in the core of the IC, for example, to reduce power consumption and to enable the use of smaller transistors, thereby reducing the overall die size.

As another example, in some ICs a higher voltage level is sometimes applied to some circuits in the core. For example, to program non-volatile memories such as programmable read-only memories (PROMs) in a programmable logic device (PLD), a much higher voltage is applied to the memory cells than is used during user operation of the same PLD.

Another situation where different voltage levels can advantageously be applied is during the power-up process in some programmable logic devices (PLDS) or other ICs. During power-up, the power level can be too low for an IC to properly reset itself. For example, in a PLD including non-volatile memory cells, such as a complex programmable logic device (CPLD), some of the memory cells might supply an incorrect value after power-up. One method of correcting this potential problem is to pump the internal power supply to a higher value during the power-up process. In other words, during power-up the power high voltage externally applied to the IC is pumped up internally to a higher value.

Thus, many situations exist where an IC includes signals that are generated by a circuit at a first power high level, then provided to another circuit operating at a higher or lower power high level. To accommodate these situations, level shifter circuits are commonly used.

FIG. 1 shows a first well-known level shifter circuit that receives an input signal IN having a lower power level Lo-V, and provides an output signal OUT having a higher power level Hi-V. (In the present specification, the same reference characters are used to refer to terminals, signal lines, and their corresponding signals.)

The level shifter circuit of FIG. 1 includes three P-channel transistors P1–P3 and three N-channel transistors N1–N3. Transistor P1 is coupled between power high level Hi-V and node OUTB, and has a gate terminal coupled to node OUT. Transistor N1 is coupled between node OUTB and ground GND, and has a gate terminal coupled to receive the input signal IN. Transistor P2 is coupled between a higher power level Hi-V and node OUT, and has a gate terminal coupled to node OUTB. Transistor N2 is coupled between node OUT and ground GND, and has a gate terminal coupled to receive a signal INB. Signal INB is provided by inverting signal IN using an inverter that includes transistors P3 and N3 coupled between a lower power level Lo-V and ground GND.

In the level shifter circuit shown in FIG. 1, transistors P1, P2, N1, and N2 are typically manufactured using a thicker oxide layer than transistors P3 and N3. This thicker oxide layer allows transistors P1, P2, N1, and N2 to withstand the higher power level Hi-V. Transistors P3 and N3 are typically manufactured using a thinner oxide layer that can withstand the lower power level Lo-V, but cannot withstand the higher power level Hi-V.

The level shifter circuit of FIG. 1 operates as follows. When the input signal IN is low (0 volts), transistor N1 is off and transistor N2 is on. Because transistor N2 is on, node OUT is low. Therefore, transistor P1 is on and node OUTB is high (Hi-V). Thus, transistor P2 is off.

When the input signal IN is high (Lo-V), transistor N1 is on and transistor N2 is off. Because transistor N1 is on, node OUTB is low. Therefore, transistor P2 is on and node OUT is high (Hi-V). Thus, transistor P1 is off.

Clearly, there is no undesirable current flow when the input signal IN is steady-state high or low. However, problems can arise when input signal IN changes state. When input signal IN changes state, there is a period when the circuit attempts to pull output nodes OUT and OUTB both up and down, i.e., both the N-channel and P-channel transistors attached to each node are turned on. This contention not only causes an undesirable crowbar current (increasing the power consumption of the IC), but also results in slower operation of the circuit. (The term "output node" as used herein does not necessarily imply that a signal on the referenced node is provided to a destination outside the circuit. However, when a node is designated as an output node, the node can generally be used to supply such a signal, if desired. Some nodes not designated as output nodes might also be able to supply an output signal.)

For example, consider the case when input signal IN changes from a low value to a high value. Initially, when input signal IN is low, signal INB is high, node OUT is low, and node OUTB is high. When signal IN goes high, transistors N1 and P1 are both on, and transistor N1 has to fight with transistor P1 to pull down node OUTB. Eventually, the voltage at node OUTB is low enough that transistor P2 begins to turn on. At this point, transistors P2 and N2 are both on. Transistor N2 eventually turns off as signal INB goes low, allowing partially-on transistor P2 to pull node OUT higher. Eventually, node OUT is finally high enough to fully turn off transistor P1, and the contention at node OUTB is resolved with a fully low value (GND) at node OUTB. Once node OUTB reaches a fully low value, transistor P2 turns fully on and node OUT is pulled completely high (Hi-V).

Because of the contention during the switching of input signal IN, it can be desirable to use larger-than-minimum sizes for the transistors in the level shifter circuit of FIG. 1. This further reduces the speed at which the circuit can operate.

Instead of (or in addition to) using larger transistors to improve the pull-up performance of the level shifter circuit, some circuit designers have inserted additional P-channel devices to improve the pull-up speed, as shown in FIG. 2. The circuit of FIG. 2 is similar to that of FIG. 1, except two new P-channel transistors (P4 and P5) are added. Transistor P4 is added between transistor N1 and node OUTB, and is gated by signal IN. Transistor P5 is added between transistor N2 and node OUT, and is gated by signal INB. Transistor P1 is now gated by node A, which lies between transistors N2 and P5. Transistor P2 is now gated by node B, which lies between transistors N1 and P4.

Transistors P4 and P5 are typically weak P-channel high voltage transistors. Because of this weakness, when signal IN changes from a low value to a high value, and transistor N1 turns on, new transistor P4 temporarily acts as a resistor and allows node B to go low faster than node OUTB. Thus, transistor P2 turns on faster than in the circuit of FIG. 1, allowing node OUT to go high more quickly. Thus, the contention on the output node OUT is more quickly resolved. Similarly, new transistor P5 allows node A to be pulled low more quickly, turning on transistor P1 more quickly when node OUTB is going high (i.e., after input signal IN goes low).

However, the drawback to this solution is that the only way to pull node OUT low is through weak transistor P5. Therefore, when input signal IN goes low and node OUT is pulled low, the transition is slower than in the circuit of FIG. 1. Similarly, when input signal IN goes high and node OUTB is pulled low, this transition is also slowed by the addition of transistor P4 to the pull-down path.

Crowbar current is often a serious consideration in the design of integrated circuits. Crowbar current can be particularly significant in level shifter circuits, which are frequently used to drive heavily loaded output pads. When many output signals change state concurrently, as is often the case, what can be a relatively unimportant crowbar current in one level shifter circuit is multiplied until it becomes a significant issue.

Therefore, it is desirable to provide level shifter circuits that allow for rapid transitions in the output values, preferably in both directions (low-to-high and high-to-low). It is further desirable to provide level shifter circuits that minimize the crowbar current during these transitions. It is further desirable to provide level shifter circuits that reduce or eliminate crowbar current during the power-up process.

SUMMARY OF THE INVENTION

The invention provides level shifter circuits that provide fast operation when changing state while generating little crowbar current. Various embodiments are presented that include one or more of the following features added to conventional level shifters: additional pull-down transistors coupled to each output node and gated by the associated input signal; additional pull-up transistors coupled to each output node or cross-coupled internal node and gated by the associated input signal; additional pull-up transistors coupled to the cross-coupled internal nodes and gated by the opposing output node; and additional pull-down transistors on the output nodes gated by a low voltage power high. Some of these additional transistors allow the input signal to operate more quickly on the output nodes, causing more rapid transitions on the output signals and reducing crowbar current in the level shifter and in the loads (e.g., output drivers) driven by the level shifter. The pull-downs gated by the low voltage power high ensure that little or no crowbar current occurs during the power-up sequence.

According to some embodiments, a level shifter circuit includes a first power terminal coupled to supply a first voltage level; a ground terminal; first and second output nodes; first and second internal nodes; a first input terminal coupled to receive a first signal having a power high level at a second voltage level; and a second input terminal coupled to receive a second input signal having a power high level at the second voltage level, the second input signal being an inverse signal to the first input signal.

The circuit also includes eight transistors. A first transistor is coupled between the first power terminal and the first output node, and has a gate terminal coupled to the second internal node. A second transistor is coupled between the first output node and the first internal node, and has a gate terminal coupled to the first input terminal. A third transistor is coupled between the first internal node and the ground terminal, and has a gate terminal coupled to the first input terminal. A fourth transistor is coupled between the first output node and the ground terminal, and has a gate terminal coupled to the first input terminal. A fifth transistor is coupled between the first power terminal and the second output node, and has a gate terminal coupled to the first internal node. A sixth transistor is coupled between the second output node and the second internal node, and has a gate terminal coupled to the second input terminal. A seventh transistor is coupled between the second internal node and the ground terminal, and has a gate terminal coupled to the second input terminal. Finally, an eighth transistor is coupled between the second output node and the ground terminal, and has a gate terminal coupled to the second input terminal. In some embodiments, the first, second, fifth, and sixth transistors are P-channel transistors and the third, fourth, seventh, and eighth transistors are N-channel transistors.

In some embodiments, the first voltage level is higher than the second voltage level. In other embodiments, the second voltage level is higher than the first voltage level. In yet other embodiments, the two voltage levels are the same.

In some embodiments, the circuit includes an inverter coupled between the first and second input terminals. The inverter is further coupled to provide one of the first and second input signals. Therefore, the inverter operates at the second voltage level. In some embodiments, the first through eighth transistors comprise a thicker oxide than transistors included in the inverter.

In some embodiments, the level shifter circuit includes a second power terminal coupled to supply the second voltage level, and additional transistors on the pull-down paths of the internal nodes and the output nodes. These additional transistors (e.g., N-channel transistors) have gate terminals coupled to the second power terminal of the circuit. These transistors function to reduce or eliminate crowbar current during the power-up sequence of the device that includes the level shifter circuit.

According to other embodiments, a level shifter circuit includes a first power terminal coupled to supply a first voltage level; a ground terminal; first and second output nodes; a first input terminal coupled to receive a first signal having a power high level at a second voltage level; and a second input terminal coupled to receive a second input signal having a power high level at the second voltage level, the second input signal being an inverse signal to the first input signal.

The circuit also includes six transistors. A first transistor is coupled between the first power terminal and the first output node, and has a gate terminal coupled to the second output node. A second transistor is coupled between the first output node and the ground terminal, and has a gate terminal coupled to the first input terminal. A third transistor is coupled between the first output node and the first power terminal, and has a gate terminal coupled to the second input terminal. A fourth transistor is coupled between the first power terminal and the second output node, and has a gate terminal coupled to the first output node. A fifth transistor is coupled between the second output node and the ground terminal, and has a gate terminal coupled to the second input terminal. Finally, a sixth transistor is coupled between the second output node and the first power terminal, and has a gate terminal coupled to the first input terminal.

In some embodiments, the circuit includes an inverter coupled between the first and second input terminals, and further coupled to provide one of the first and second input signals. In some embodiments, the first through sixth transistors comprise a thicker oxide than transistors included in the inverter.

In some embodiments, the first and fourth transistors are P-channel transistors and the second, third, fifth, and sixth transistors are N-channel transistors. In at least one such embodiment, the circuit also includes a seventh transistor. The seventh transistor is an N-channel transistor coupled between the third transistor and the first power terminal, and further coupled between the sixth transistor and the first power terminal. The seventh transistor has a gate terminal coupled to the first power terminal. Thus, the seventh transistor acts as a resistor, reducing the power high voltage delivered to the third and sixth transistors. In some of these embodiments, therefore, the third and sixth transistors, along with the seventh transistor, can be manufactured using the thinner oxide used for the transistors in an inverter coupled between the first and second input terminals.

According to other embodiments, a level shifter circuit includes a first power terminal coupled to supply a first voltage level; a ground terminal; first and second output nodes; first and second internal nodes; a first input terminal coupled to receive a first signal having a power high level at a second voltage level; and a second input terminal coupled to receive a second input signal having a power high level at the second voltage level, the second input signal being an inverse signal to the first input signal.

The circuit also includes eight transistors. A first transistor is coupled between the first power terminal and the first output node, and has a gate terminal coupled to the second internal node. A second transistor is coupled between the first output node and the first internal node, and has a gate terminal coupled to the first input terminal. A third transistor is coupled between the first internal node and the ground terminal, and has a gate terminal coupled to the first input terminal. A fourth transistor is coupled between the first internal node and the first power terminal, and has a gate terminal coupled to the second input terminal. A fifth transistor is coupled between the first power terminal and the second output node, and has a gate terminal coupled to the first internal node. A sixth transistor is coupled between the second output node and the second internal node, and has a gate terminal coupled to the second input terminal. A seventh transistor is coupled between the second internal node and the ground terminal, and has a gate terminal coupled to the second input terminal. An eighth transistor is coupled between the second internal node and the first power terminal, and has a gate terminal coupled to the first input terminal.

In some embodiments, the first, second, fifth, and sixth transistors are P-channel transistors and the third, fourth, seventh, and eighth transistors are N-channel transistors.

According to other embodiments, a level shifter circuit includes a first power terminal coupled to supply a first voltage level; a ground terminal; first and second output nodes; first and second internal nodes; a first input terminal coupled to receive a first signal having a power high level at a second voltage level; and a second input terminal coupled to receive a second input signal having a power high level at the second voltage level, the second input signal being an inverse signal to the first input signal.

The circuit also includes eight transistors. A first transistor is coupled between the first power terminal and the first output node, and has a gate terminal coupled to the second internal node. A second transistor is coupled between the first output node and the first internal node, and has a gate terminal coupled to the first input terminal. A third transistor is coupled between the first internal node and the ground terminal, and has a gate terminal coupled to the first input terminal. A fourth transistor is coupled between the first internal node and the first power terminal, and has a gate terminal coupled to the second output node. A fifth transistor is coupled between the first power terminal and the second output node, and has a gate terminal coupled to the first internal node. A sixth transistor is coupled between the second output node and the second internal node, and has a gate terminal coupled to the second input terminal. A seventh transistor is coupled between the second internal node and the ground terminal, and has a gate terminal coupled to the second input terminal. An eighth transistor is coupled between the second internal node and the first power terminal, and has a gate terminal coupled to the first output node.

Some embodiments also include ninth and tenth transistors. The ninth transistor is an N-channel transistor coupled between the first output node and the ground terminal, and has a gate terminal coupled to the first input terminal. The tenth transistor is an N-channel transistor coupled between the second output node and the ground terminal, and has a gate terminal coupled to the second input terminal.

According to some embodiments, a level shifter circuit includes a first power terminal coupled to supply a first voltage level; a second power terminal coupled to supply a second voltage level; a ground terminal; first and second output nodes; a first input terminal coupled to receive a first input signal having a power high level at the second voltage level; and a second input terminal coupled to receive a second input signal having a power high level at the second voltage level, the second input signal being an inverse signal to the first input signal.

The circuit also includes six transistors. A first transistor is coupled between the first power terminal and the first output node, and has a gate terminal coupled to the second output node. Second and third transistors are coupled in series between the first output node and the ground terminal, the second transistor having a gate terminal coupled to the first input terminal and the third transistor having a gate terminal coupled to the second power terminal. A fourth transistor is coupled between the first power terminal and the second output node, and has a gate terminal coupled to the first output node. Fifth and sixth transistors are coupled in series between the second output node and the ground terminal, the fifth transistor having a gate terminal coupled to the second input terminal and the sixth transistor having a gate terminal coupled to the second power terminal. In some embodiments, the first and fourth transistors are P-channel transistors and the second, third, fifth, and sixth transistors are N-channel transistors.

According to other embodiments, a level shifter circuit includes a first power terminal coupled to supply a first voltage level; a second power terminal coupled to supply a second voltage level; a ground terminal; first and second output nodes; first and second internal nodes; a first input terminal coupled to receive a first input signal having a power high level at the second voltage level; and a second input terminal coupled to receive a second input signal having a power high level at the second voltage level, the second input signal being an inverse signal to the first input signal.

The circuit also includes eight transistors. A first transistor is coupled between the first power terminal and the first output node, and has a gate terminal coupled to the second internal node. A second transistor is coupled between the first output node and the first internal node, and has a gate terminal coupled to the first input terminal. Third and fourth transistors are coupled in series between the first internal node and the ground terminal, the third transistor having a gate terminal coupled to the first input terminal and the fourth transistor having a gate terminal coupled to the second power terminal. A fifth transistor is coupled between the first power terminal and the second output node, and has a gate terminal coupled to the first internal node. A sixth transistor is coupled between the second output node and the second internal node, and has a gate terminal coupled to the second input terminal. Seventh and eighth transistors are coupled in series between the second internal node and the ground terminal, the seventh transistor having a gate terminal coupled to the second input terminal and the eighth transistor having a gate terminal coupled to the second power terminal. In some embodiments, the first, second, fifth, and sixth transistors are P-channel transistors and the third, fourth, seventh, and eighth transistors are N-channel transistors.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 2:
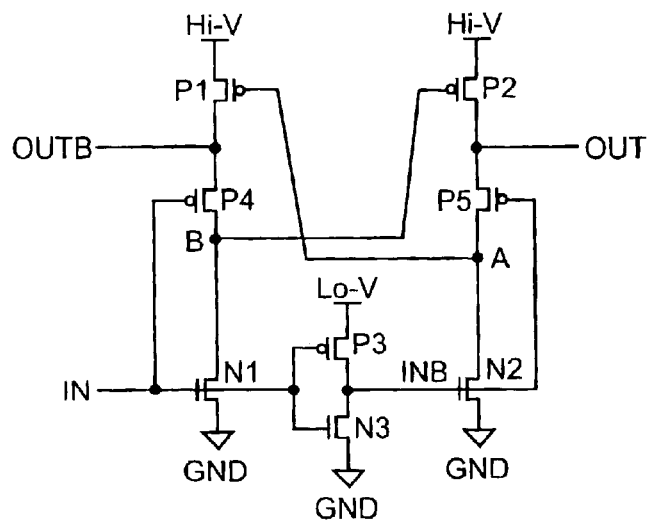
FIG. 2 is a schematic diagram of a second prior art level shifter circuit.

As noted in the "Background" section, above, the level shifter circuit shown in FIG. 2 is relatively fast when transitioning from a low to a high output value. However, when transitioning from a high to a low output value, the speed of the transition is limited by the weak transistors (P4, P5) inserted on the pull-down path of each output node (OUTB, OUT). To remedy this deficiency, additional pull-downs can be added, as shown in FIG. 3.

Figure 3:
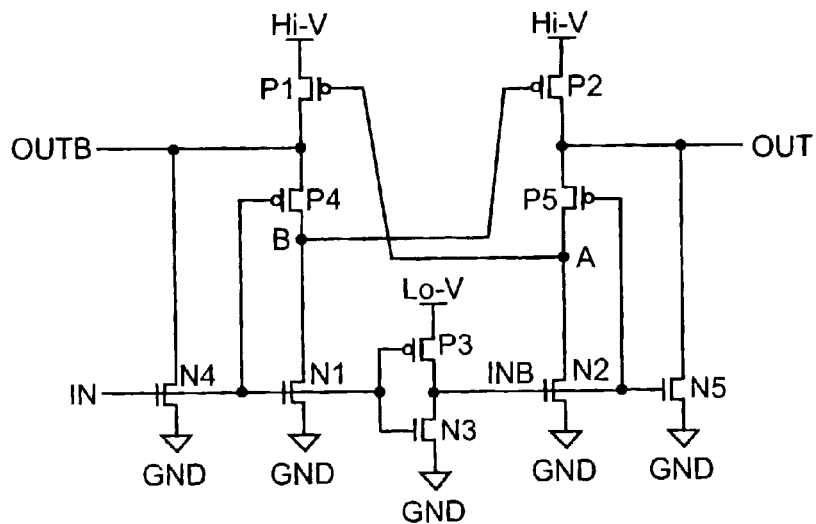
FIG. 3 is a schematic diagram of a level shifter circuit according to a first embodiment of the invention.

FIG. 3 shows a level shifter circuit similar to that shown in FIG. 2, but with additional N-channel transistors N4, N5, respectively coupled between nodes OUTB, OUT and ground GND. Transistor N4 is gated by the input signal IN, and transistor N5 is gated by signal INB. When signal IN goes high and turns on transistor N1 to pull node B down, transistor N4 is also turned on and pulls down on node OUTB. When signal INB goes high and turns on transistor N2 to pull node A down, transistor N is also turned on and pulls down on node OUT. Thus, the circuit of FIG. 3 has the speed of the circuit of FIG. 2 when the output nodes OUT, OUTB are pulled up, but is also faster when output nodes OUT, OUTB are pulled down.

In some embodiments, transistors P1 and P2 are given different threshold voltages, using techniques well known in the field of circuit design. Creating a difference in the threshold voltages of the pull-up transistors in a cross-coupled circuit is one method of influencing in which state the circuit will settle when the device is first powered-up.

The circuit of FIG. 3 can still be improved. Note that a series of sequential steps must still be performed whenever one of the output nodes OUT, OUTB is pulled high. For example, suppose that node OUTB is to be pulled high. When signal IN goes low, the direct pull-down N4 on node OUTB is turned off. After a delay for the inverter (P3 and N3) on input signal IN, transistor N2 is turned on and pulls down node A. Transistor P1 finally turns on and pulls node OUTB high. This series of steps slows down the circuit whenever either of nodes OUT, OUTB is going high and providing an output signal for the circuit.

Figure 4:
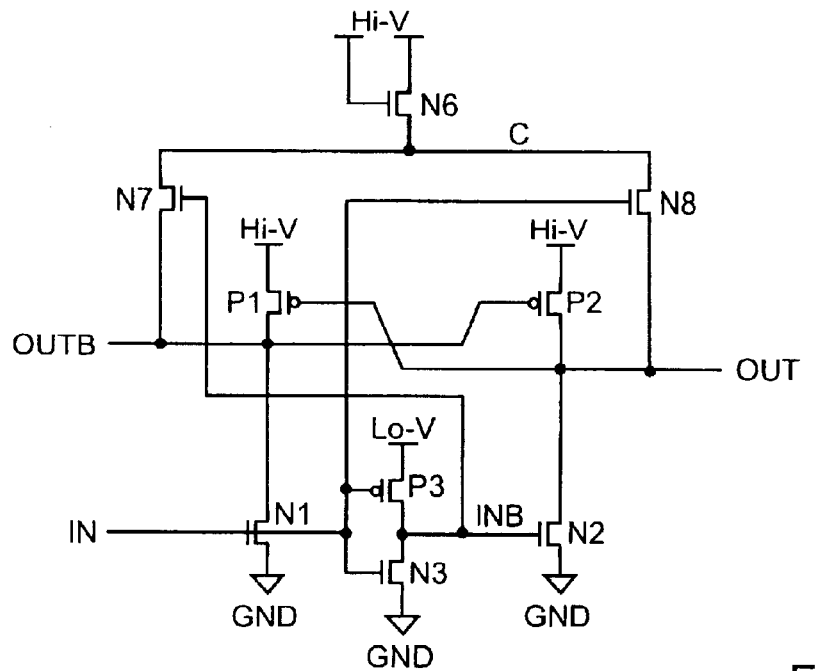
FIG. 4 is a schematic diagram of a level shifter circuit according to a second embodiment of the invention.

FIG. 4 shows a level shifter circuit in which the output nodes go high more rapidly than in the circuit of FIG. 3. The level shifter circuit of FIG. 4 is similar to that shown in FIG. 1, but includes three additional N-channel transistors N6, N7, and N8. Transistor N6 is coupled between power high level Hi-V and internal node C, and is gated by power high Hi-V. Transistor N7 is coupled between internal node C and output node OUTB. Transistor N8 is coupled between internal node C and output node OUT.

In preferred embodiments, transistors P1, P2, N1, and N2 have a thicker oxide than transistors N3 and P3, being designed to withstand a higher power high value. (In some embodiments, transistors N3 and P3 are also designed with the thicker oxide, although this is not necessary when power high Lo-V is lower than power high Hi-V.) In some of these embodiments, transistors N6–N8 also have the thicker oxide, which imparts greater reliability to the circuit. However, in some embodiments, transistors N6–N8 use the thinner oxide, which gives greater speed. The thinner oxide can be used because of the presence of transistor N6, which acts to reduce the maximum gate-to-source potential of transistors N7 and N8, as is now explained.

Without transistor N6, the maximum gate-to-source potential for transistors N7 and N8 would be Hi-V, which generally requires a thicker oxide for these transistors. However, transistor N6 is always on, and acts to reduce the voltage at node C from power high Hi-V to one N-channel threshold below Hi-V (Hi-V–Vth). Therefore, with transistor N6 present, the maximum gate-to-source potential for transistors N7 and N8 is (Hi-V–Vth). Clearly, the maximum gate-to-source potential for transistor N6 is (Hi-V–(Hi-V–Vth)), or Vth. Hence, the thicker oxide is not required for any of transistors N6–N8.

Figure 1:
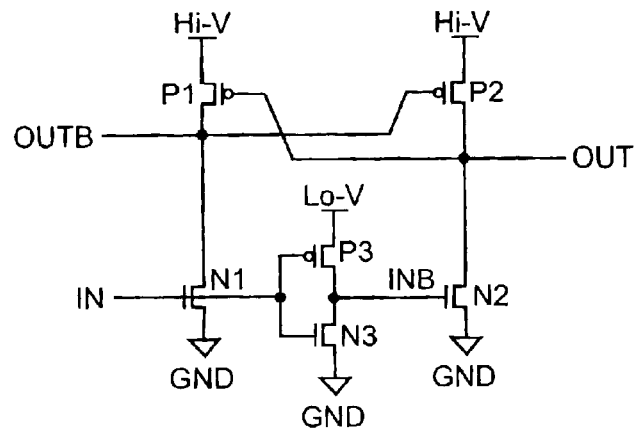
FIG. 1 is a schematic diagram of a first prior art level shifter circuit.

The level shifter circuit of FIG. 4 has lower crowbar current than, for example, the prior art circuit of FIG. 1. The lower crowbar current is accomplished by speeding up the pull-ups on the output nodes without hurting the pull-down speed. For example, assume that power high level Hi-V is higher than power high voltage Lo-V minus the N-channel threshold voltage. (This relationship usually holds in practice, but the circuits of the present invention are not so limited. In fact, the circuits of the invention do not require even that power high level Hi-V be greater than power high level Lo-V.) Assume also that the input signal IN is low, output node OUT is also low (0 volts), and output node OUTB is high (Hi-V). Node INB is high, with a high power level of Lo-V.

In this exemplary situation, the circuit of FIG. 4 functions as follows. When input signal IN goes high (Lo-V), transistor N8 quickly turns on. Because of the voltage drop across transistor N8, the potential at node OUT quickly rises to (Lo-V–Vth), which in turn partially turns off transistor P1. Thus, as transistor N1 works to pull output node OUTB low, transistor N1 is not fighting a fully-on transistor P1, as in prior art level shifter circuits. Crowbar current is reduced, and the circuit switches more rapidly.

As node OUTB goes low, transistor P2 turns on. Because of transistor N8, node OUT is already charged up to a voltage level of (Lo-V–Vth). Thus, node OUT is more rapidly pulled up to a value of Hi-V than in prior art level shifters, in which the potential at node OUT must be raised all the way from 0 volts (ground) to power high Hi-V.

When node OUT reaches a sufficiently high power level, transistor P1 is fully off, and node OUTB is pulled fully to 0 volts. The state change for the circuit is complete.

Figure 5:
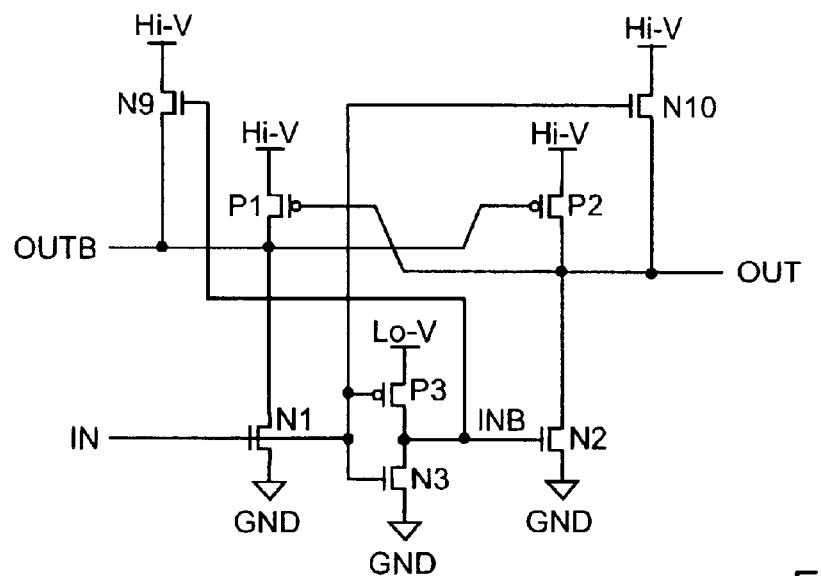
FIG. 5 is a schematic diagram of a level shifter circuit according to a third embodiment of the invention.

FIG. 5 illustrates another embodiment similar to that of FIG. 4, from which transistor N6 is omitted. As described above, the presence of transistor N6 allows transistors N7 and N8 to use a thinner oxide than transistors N1, N2, P1, and P2, if desired. However, transistor N6 is not necessary if a thicker oxide is used for transistors N9 and N10. The embodiment of FIG. 5 functions in the same fashion as the circuit of FIG. 4.

Figure 6:
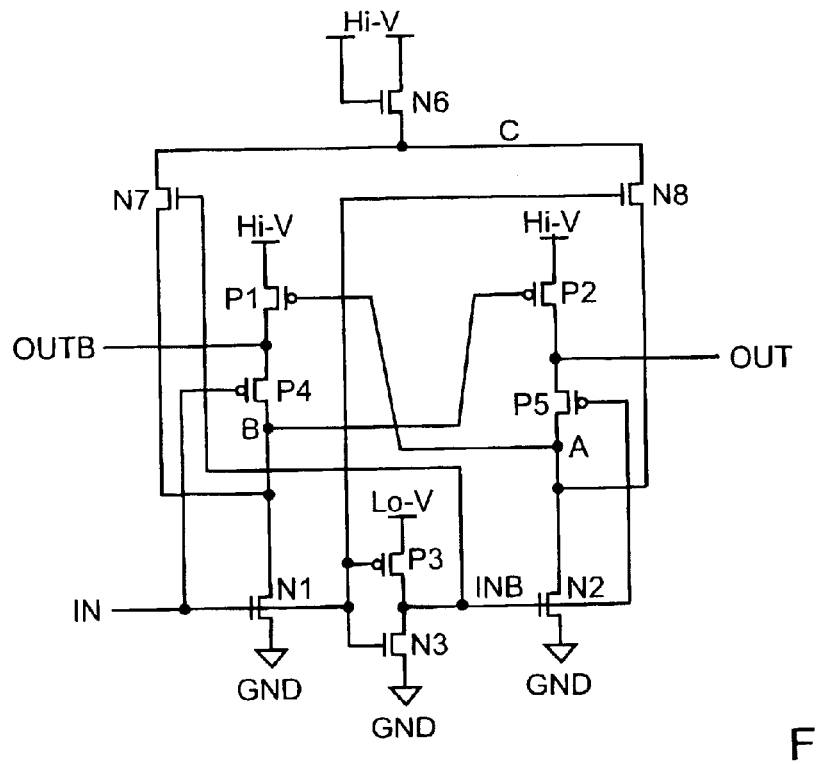
FIG. 6 is a schematic diagram of a level shifter circuit according to a fourth embodiment of the invention.

FIG. 6 illustrates another embodiment of the invention in which transistors N6–N8 (as shown in FIG. 4) are applied to the prior art level shifter circuit shown in FIG. 2. Transistors N7 and N8 are applied to internal nodes B and A, respectively, rather than to output nodes OUTB and OUT, so their pull-up effect will more rapidly affect transistors P2 and P1. Transistors N7 and N8 act to rapidly raise internal nodes B and A to a voltage level of (Lo-V–Vth). Thus, these transistors provide an intermediate voltage step that facilitates a rapid change from a low output value of 0 volts to a high value of Hi-V on either of the two output nodes. Transistor N6 is optional, and can be omitted when transistors N7 and N8 have the same thick oxide as, for example, transistors N1, N2, P1, and P2.

Figure 7:
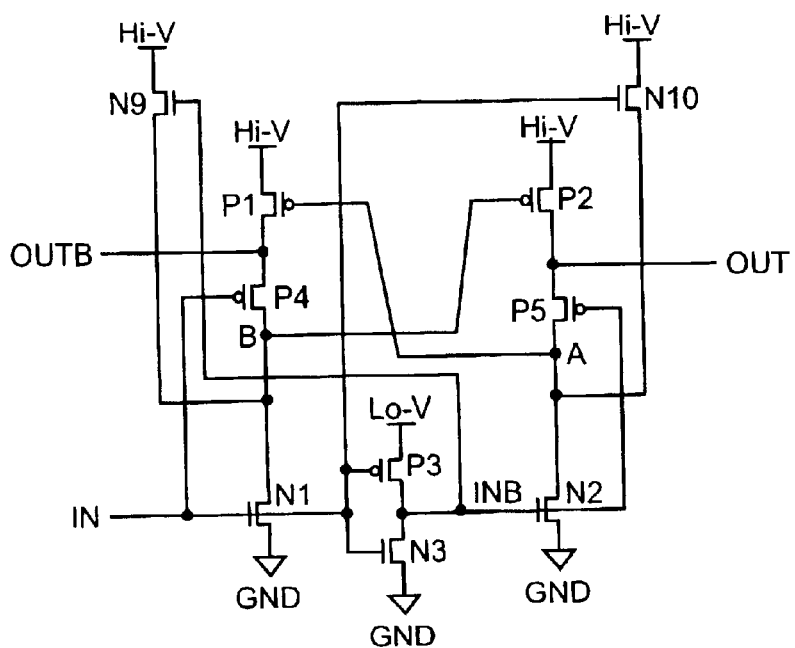
FIG. 7 is a schematic diagram of a level shifter circuit according to a fifth embodiment of the invention.

FIG. 7 illustrates another embodiment of the invention similar to FIG. 6, but in which transistor N6 is omitted.

Figure 8:
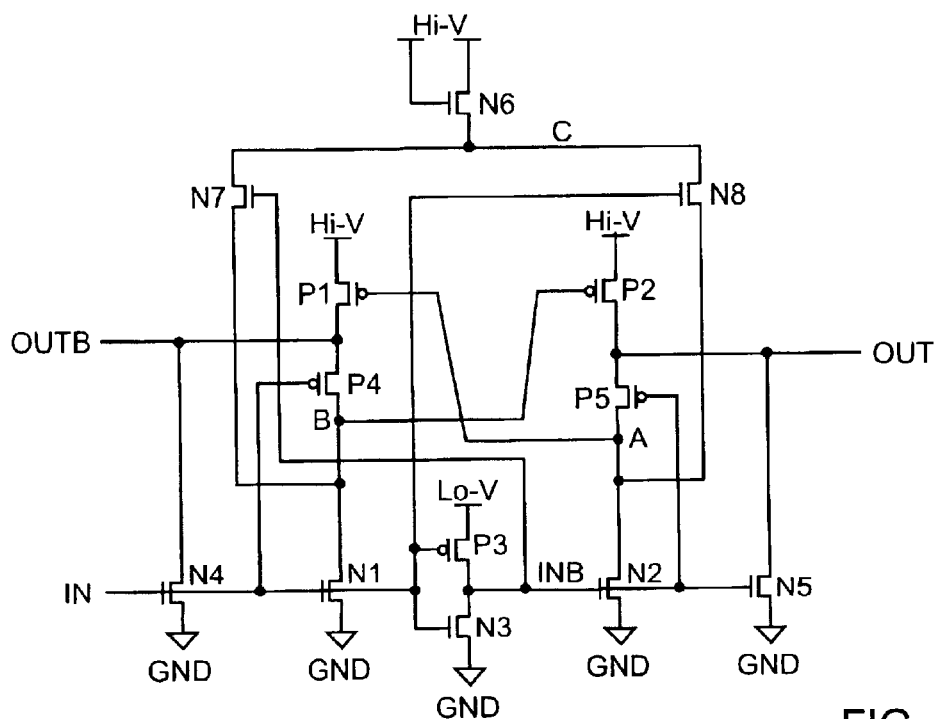
FIG. 8 is a schematic diagram of a level shifter circuit according to a sixth embodiment of the invention.

FIG. 8 illustrates another embodiment of the invention that applies not only transistors N6–N8 (see FIG. 4), but also transistors N4 and N5 (see FIG. 3) to the prior art level shifter circuit of FIG. 2. As described in connection with FIG. 4, transistors N6–N8 provide faster low-to-high switching on each of output nodes OUT and OUTB. As described in connection with FIG. 3, transistors N4 and N5 provide faster high-to-low switching on each of output nodes OUT and OUTB.

Figure 9:
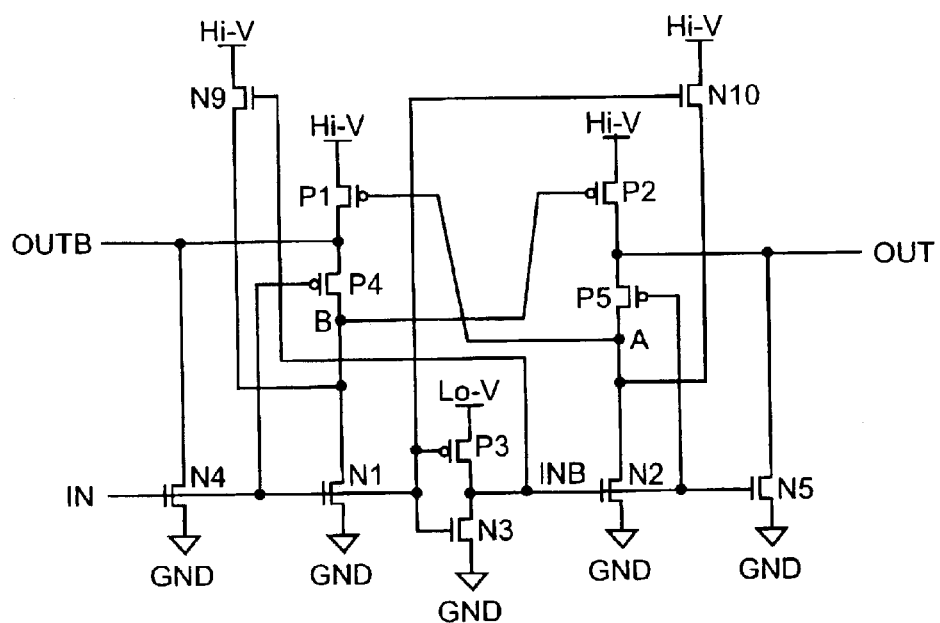
FIG. 9 is a schematic diagram of a level shifter circuit according to a seventh embodiment of the invention.

FIG. 9 illustrates another embodiment of the invention similar to FIG. 8, but in which transistor N6 is omitted.

Figure 10:
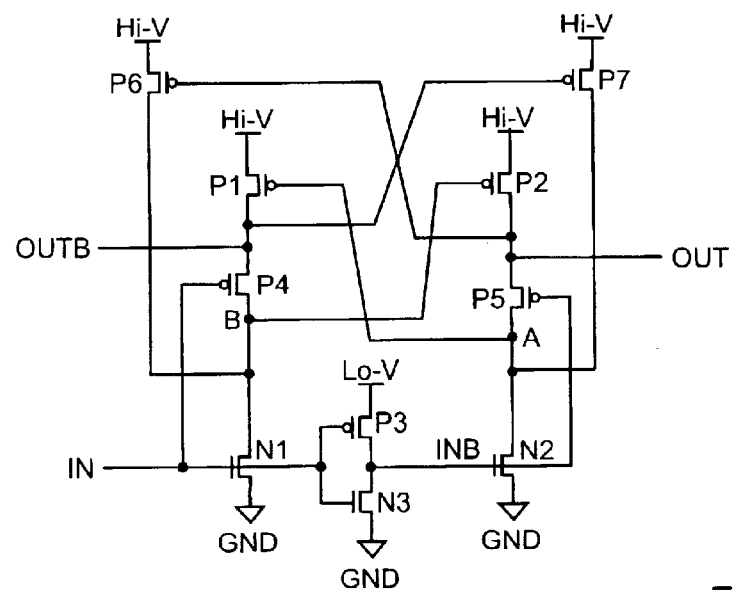
FIG. 10 is a schematic diagram of a level shifter circuit according to an eighth embodiment of the invention.

FIG. 10 is the first of several figures illustrating another aspect of the invention, in which P-channel devices are used to facilitate rapid low-to-high switching on the output nodes. To the basic level shifter circuit of FIG. 2, P-channel transistors P6 and P7 are added, each providing an additional pull-up between its respective internal node (B, A) and power high Hi-V. Transistor P6 pulls up on internal node B, and is gated by node OUT. Transistor P7 pulls up on internal node A, and is gated by node OUTB.

In preferred embodiments, transistors P1, P2, N1, and N2 have a thicker oxide than transistors N3 and P3, being designed to withstand a higher power high value. (In some embodiments, transistors N3 and P3 are also designed with the thicker oxide, although this is not necessary when power high Lo-V is lower than power high Hi-V.) In some of these embodiments, transistors P6 and P7 also have the thicker oxide, which imparts greater reliability to the circuit.

The level shifter circuit of FIG. 10 operates to pull either of output nodes OUT and OUTB from 0 volts to power high Hi-V faster than in prior art level shifter circuits. For example, as described in connection with the circuit of FIG. 4, assume that power high level Hi-V is higher than power high voltage Lo-V minus the N-channel threshold voltage. Assume also that the input signal IN is low, output node OUT is also low (o volts), and output node OUTB is high (Hi-V). Node INB is high, with a high power level of Lo-V.

In this exemplary situation, the circuit of FIG. 10 functions as follows. When input signal IN goes high (Lo-V), transistor N1 turns on, while transistor P4 partially turns off. (Transistor P4 turns off only partially, because signal IN rises only to power high Lo-V, while node OUTB is at power high Hi-V.) Internal node B falls from a high value (Hi-V) towards ground, and turns on transistor P2. Signal INB goes low, turning off transistor N2 and partially turning on transistor P5. Internal node A rises to a high value (Hi-V), turning off transistor P1. As the voltage on node OUTB falls, transistor P7 turns on, facilitating the rise of node A. The high value on node A turns off transistor P1 completely, which brings node B fully to ground. Node B, in turn, turns on transistor P2 completely, pulling node OUT to power high Hi-V more quickly than can be done through transistor P5. Thus, node OUT goes high more quickly than in the circuit of FIG. 2. Further, the contention on the output node OUT is more quickly resolved, reducing the crowbar current.

Similarly, transistor P6 pulls node OUTB high more quickly than in the circuit of FIG. 2 after input signal IN goes low.

Figure 11:
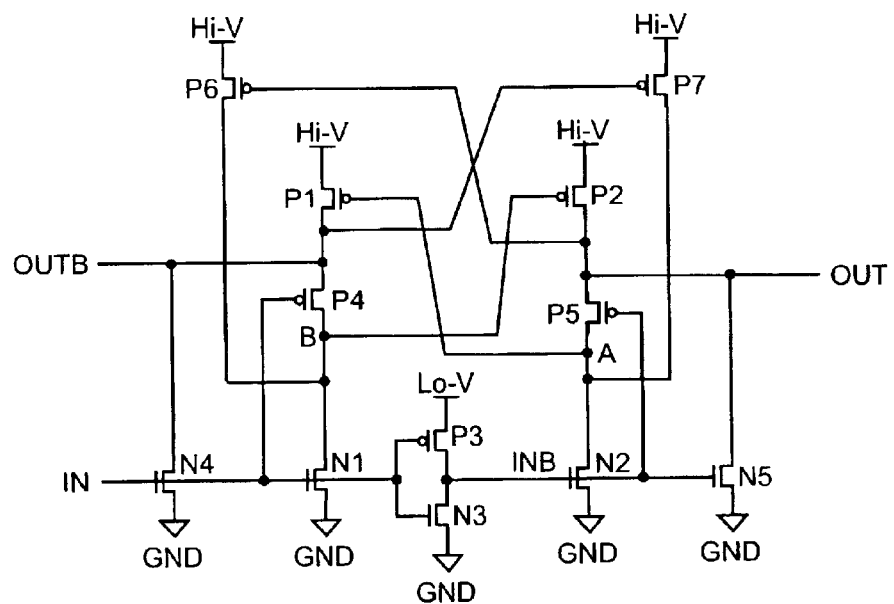
FIG. 11 is a schematic diagram of a level shifter circuit according to a ninth embodiment of the invention.

FIG. 11 illustrates another embodiment of the invention that applies not only transistors P6 and P7 (see FIG. 10), but also transistors N4 and N5 (see FIG. 3) to the prior art level shifter circuit of FIG. 2. As described in connection with FIG. 10, transistors P6 and P7 provide faster low-to-high switching on each of output nodes OUT and OUTB. As described in connection with FIG. 3, transistors N4 and N5 provide faster high-to-low switching on each of output nodes OUT and OUTB.

FIGS. 12–15 illustrate another aspect of the invention, in which another operational limitation of prior art level shifter circuits is addressed. The level shifter circuits described herein address situations where two different power high levels are available. It is not uncommon for the two power supplies to begin supplying power at different times. For example, an external power supply can begin applying power high level Hi-V while an internal power supply Lo-V is still low. In this situation, when power high Lo-V begins to rise, but is still below the threshold voltage of an N-channel transistor, leakage current can occur in the level shifter. Node INB is floating, and can be capacitively coupled to any node at power high Hi-V, assuming a high value that turns on transistors N2 and N5, and causing a leakage current to occur through these transistors.

To prevent the occurrence of this situation, according to one aspect of the present invention, additional N-channel transistors are added to the pull-down paths on the output nodes. The additional transistors are gated by power high Lo-V. Thus, while power high Lo-V is below the threshold voltage of an N-channel transistor, these transistors are off, blocking current flow through the level shifter. When power high Lo-V reaches the threshold voltage of an N-channel transistor, the transistors turn on, and the level shifter circuit operates as if the additional transistors were not present.

Figure 12:
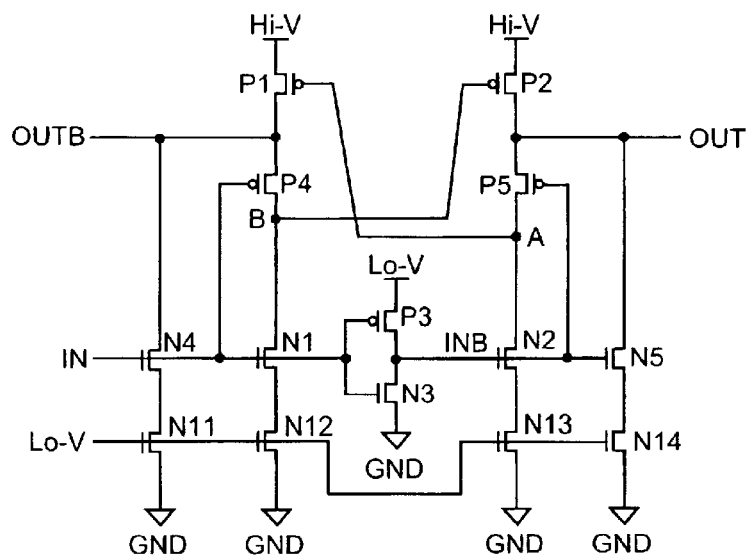
FIG. 12 is a schematic diagram of a level shifter circuit according to a tenth embodiment of the invention.

FIG. 12 shows one such circuit, in which the level shifter circuit of FIG. 3 is modified to include transistor N11 in series with transistor N4, transistor N12 in series with transistor N1, transistor N13 in series with transistor N2, and transistor N14 in series with transistor N5.

In many applications, e.g., in programmable logic devices, it is desirable to be able to control the state in which a level shifter circuit will emerge from the power-up sequence. For example, after power is applied to a device containing the circuit, it can be helpful to know that node OUT will be low and node OUTB will be high. As described above, one method of influencing the outcome of the power-up sequence is to manufacture the pull-ups (e.g., transistors P1, P2) such that they have two different threshold voltages. The circuit of FIG. 13 applies a different method of approaching this issue.

Figure 13:
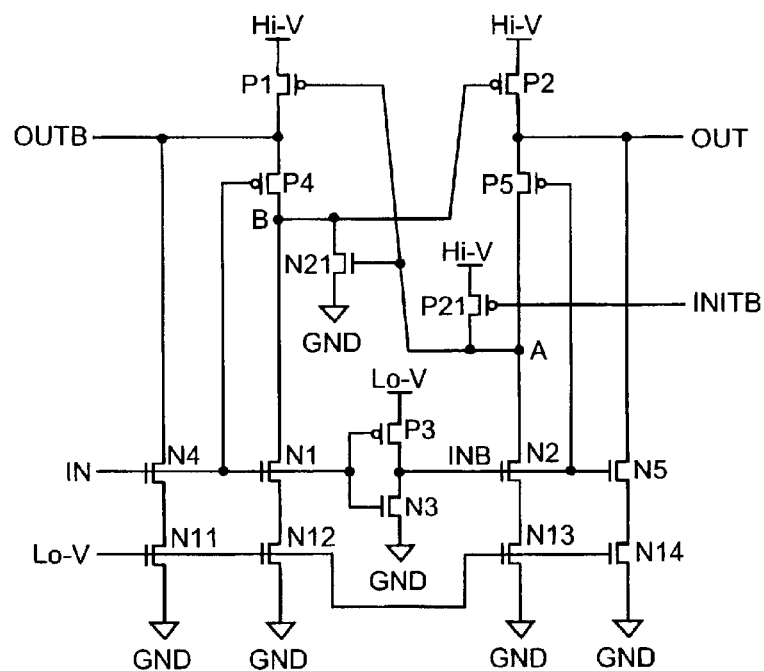
FIG. 13 is a schematic diagram of a level shifter circuit according to a eleventh embodiment of the invention.

FIG. 13 illustrates a circuit similar to that of FIG. 12, but including initialization transistors P21 and N21. Transistor N21 is coupled between node B and ground, and is gated by node A. Transistor P21 is coupled between node A and power high Hi-V, and is gated by an input signal INITB. Signal INITB has a value of either 0 volts (ground) or power high Hi-V. When signal INITB goes low, node A is pulled high (Hi-V). Transistor N21 turns on, which pulls node B low. Thus, transistor P2 turns on, driving node OUT high. For example, the low value on signal INITB can be asserted during the power-up sequence of the device that includes the level shifter circuit, and the INITB signal can be maintained at a low value until after the power-up sequence is complete. Signal INITB can be provided, for example, by a level shifter circuit employing pull-ups having two different threshold voltages, as previously described in connection with FIG. 3.

Table 1 shows exemplary device sizes for one embodiment of the circuit shown in FIG. 13. Device sizes are given in unit of microns, where x/y indicates width/length. In the embodiment of Table 1, all transistors are thick oxide devices except for transistors P3 and N3. The Lo-V voltage can be, for example, 1.65 volts, while the Hi-V voltage can be, for example, either 1.65 V or 3.3 volts.

TABLE 1

| Device | Size | Device | Size |
|---|---|---|---|
| N1 | 15/0.34 | P1 | 15/0.34 |
| N2 | 15/0.34 | P2 | 15/0.34 |
| N3 | 3.0/0.18 | P3 | 6.0/0.18 |
| N4 | 30/0.34 | P4 | 0.44/0.34 |
| N5 | 30/0.34 | P5 | 0.44/0.34 |
| N11 | 30/0.18 | P21 | 0.44/0.6 |
| N12 | 15/0.18 | | |
| N13 | 15/0.18 | | |
| N14 | 30/0.18 | | |
| N21 | 0.44/0.4 | | |

Figure 14:
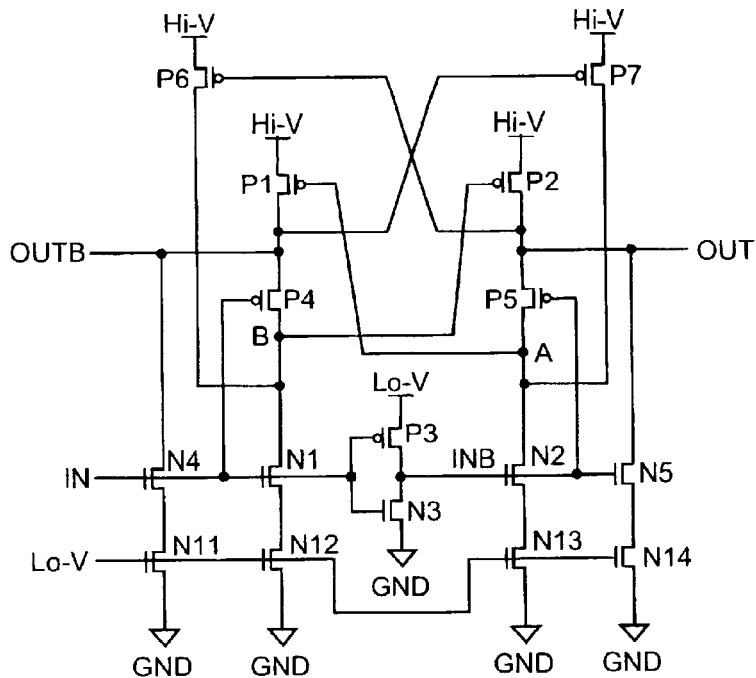
FIG. 14 is a schematic diagram of a level shifter circuit according to a twelfth embodiment of the invention.

FIG. 14 illustrates another embodiment similar to that of FIG. 12, but where transistors P6, P7 are also applied to internal nodes B and A, as in (for example) the circuit of FIG. 10.

Figure 15:
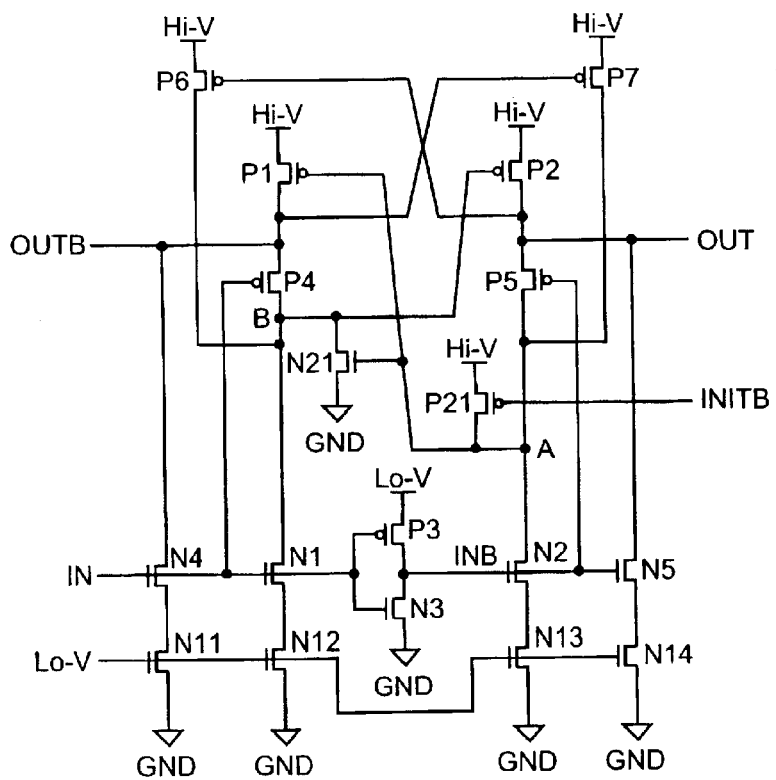
FIG. 15 is a schematic diagram of a level shifter circuit according to a thirteenth embodiment of the invention.

FIG. 15 illustrates another embodiment, similar to that of FIG. 13 but where transistors P6, P7 are also applied to internal nodes B and A, as in (for example) the circuit of FIG. 10. Table 2 shows exemplary device sizes for one embodiment of the circuit shown in FIG. 15. Device sizes are given in unit of microns, where x/y indicates width/length. In the embodiment of Table 2, all transistors are thick oxide devices except for transistors P3 and N3. The Lo-V voltage can be, for example, 1.65 volts, while the Hi-V voltage can be, for example, either 1.65 V or 3.3 volts.

TABLE 2

| Device | Size | Device | Size |
|---|---|---|---|
| N1 | 15/0.34 | P1 | 15/0.34 |
| N2 | 15/0.34 | P2 | 15/0.34 |
| N3 | 3.0/0.18 | P3 | 6.0/0.18 |
| N4 | 30/0.34 | P4 | 0.44/0.34 |
| N5 | 30/0.34 | P5 | 0.44/0.34 |
| N11 | 30/0.18 | P6 | 0.44/0.34 |
| N12 | 15/0.18 | P7 | 0.44/0.34 |
| N13 | 15/0.18 | P21 | 0.44/0.6 |
| N14 | 30/0.18 | | |
| N21 | 0.44/0.4 | | |

Note that the additional transistors (N11, N12, N13, and N14) gated by power level Lo-V can be added to any of the level shifter circuits shown herein. In those circuits lacking transistors N4 and N5, only two additional transistors are required to provide this protection, corresponding to transistors N12 and N13 in FIGS. 12–15. Note further that the additional transistors can be added on either side of the existing pull-down transistors, i.e., they need not be added on the ground side as shown in the illustrated examples.

Figure 16:
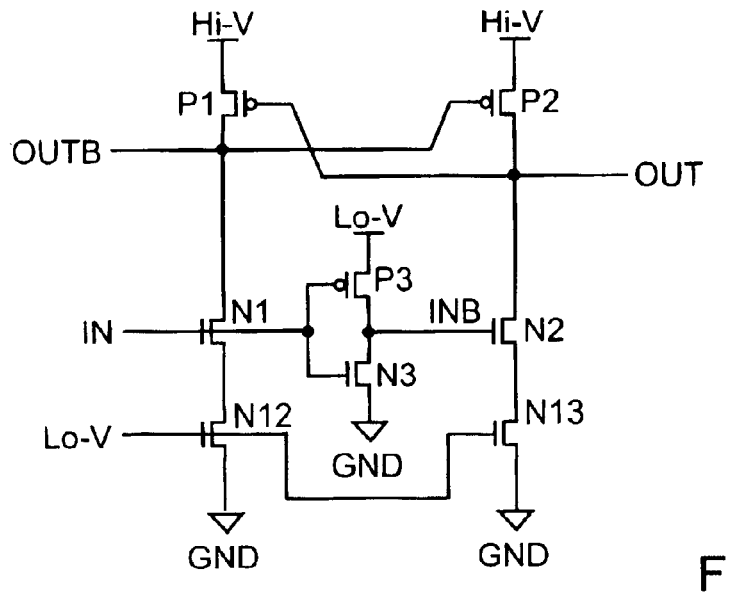
FIG. 16 is a schematic diagram of a level shifter circuit according to a fourteenth embodiment of the invention.

FIG. 16 shows how transistors N12 and N13 can be added to the level shifter circuit of FIG. 1 to provide protection against crowbar current during the power-up sequence.

Figure 17:
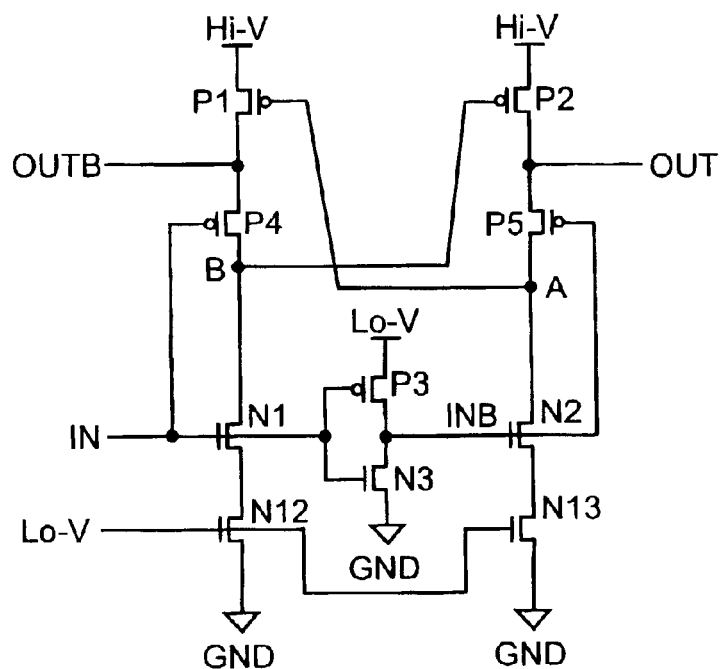
FIG. 17 is a schematic diagram of a level shifter circuit according to a fifteenth embodiment of the invention.

FIG. 17 shows how transistors N12 and N13 can be added to the level shifter circuit of FIG. 2 to provide protection against crowbar current during the power-up sequence.

Figure 18:
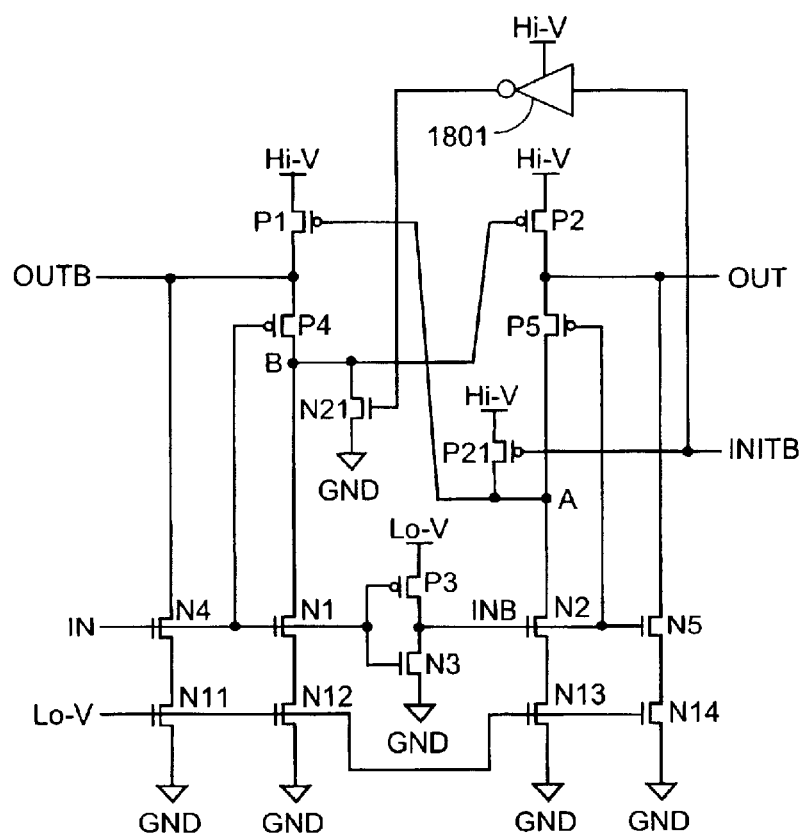
FIG. 18 is a schematic diagram of a level shifter circuit according to a sixteenth embodiment of the invention.

FIG. 18 illustrates a level shifter circuit similar to that of FIG. 13. However, N-channel transistor N21 is now gated by inverter 1801, which provides an inverse signal from signal INITB. Inverter 1801 is coupled between power high Hi-V and ground. Thus, the signal driving the gate of transistor N21 has a power high level of Hi-V. This circuit can have an advantage over the circuit of FIG. 13 in some situations, because whenever signal INITB is high (e.g., after power-up) both transistors N21 and P21 are fully off. (In the circuit of FIG. 13, only transistor P21 is fully off whenever signal INITB is high.) Thus, the level shifter circuit is balanced in terms of the shifting delays of the two output nodes OUT and OUTB.

Figure 19:
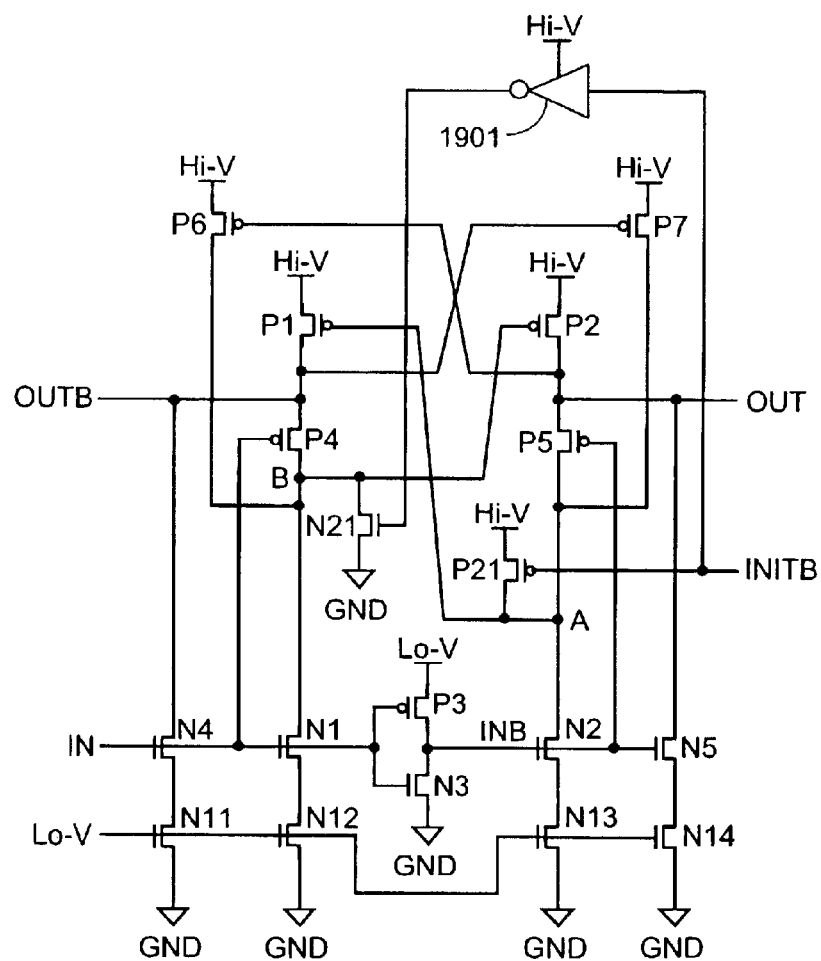
FIG. 19 is a schematic diagram of a level shifter circuit according to a seventeenth embodiment of the invention.

FIG. 19 illustrates a level shifter circuit similar to that of FIG. 15, but having an initialization circuit similar to that of FIG. 18.

Those having skill in the relevant arts of the invention will now perceive various modifications and additions that can be made as a result of the disclosure herein. For example, transistors, N-channel transistors, P-channel transistors, pull-ups, pull-downs, inverters, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A level shifter circuit, comprising:
 a first power terminal coupled to supply a first voltage level;
 a ground terminal;
 first and second output nodes;
 first and second internal nodes;
 a first input terminal coupled to receive a first input signal having a power high level at a second voltage level;
 a second input terminal coupled to receive a second input signal having a power high level at the second voltage level, the second input signal being an inverse signal to the first input signal;
 a first transistor coupled between the first power terminal and the first output node and having a gate terminal coupled to the second internal node;
 a second transistor coupled between the first output node and the first internal node and having a gate terminal coupled to the first input terminal;
 a third transistor coupled between the first internal node and the ground terminal and having a gate terminal coupled to the first input terminal;
 a fourth transistor coupled between the first output node and the ground terminal and having a gate terminal coupled to the first input terminal;
 a fifth transistor coupled between the first power terminal and the second output node and having a gate terminal coupled to the first internal node;
 a sixth transistor coupled between the second output node and the second internal node and having a gate terminal coupled to the second input terminal;
 a seventh transistor coupled between the second internal node and the ground terminal and having a gate terminal coupled to the second input terminal; and
 an eighth transistor coupled between the second output node and the ground terminal and having a gate terminal coupled to the second input terminal.

2. The level shifter circuit of claim 1, wherein the first voltage level is higher than the second voltage level.

3. The level shifter circuit of claim 1, wherein the first, second, fifth, and sixth transistors are P-channel transistors and the third, fourth, seventh, and eighth transistors are N-channel transistors.

4. The level shifter circuit of claim 1, wherein:
 the level shifter circuit further comprises an inverter coupled between the first and second input terminals and further coupled to provide one of the first and second input signals, the inverter including transistors; and
 the first through eighth transistors comprise a thicker oxide than the transistors included in the inverter.

5. The level shifter circuit of claim 1, further comprising:
 a second power terminal coupled to supply the second voltage level;
 a first additional transistor coupled in series with the fourth transistor between the first output node and the ground terminal and having a gate terminal coupled to the second power terminal;
 a second additional transistor coupled in series with the third transistor between the first internal node and the ground terminal and having a gate terminal coupled to the second power terminal;
 a third additional transistor coupled in series with the seventh transistor between the second internal node and the ground terminal and having a gate terminal coupled to the second power terminal; and
 a fourth additional transistor coupled in series with the eighth transistor between the second output node and the ground terminal and having a gate terminal coupled to the second power terminal.

6. The level shifter circuit of claim 1, wherein:
 the first, second, fifth, and sixth transistors are P-channel transistors;
 the third, fourth, seventh, and eighth transistors are N-channel transistors; and
 the first, second, third, and fourth additional transistors are N-channel transistors.

7. A level shifter circuit, comprising:
 a first power terminal coupled to supply a first voltage level;
 a ground terminal;
 first and second output nodes;
 a first input terminal coupled to receive a first input signal having a power high level at a second voltage level;
 a second input terminal coupled to receive a second input signal having a power high level at the second voltage level, the second input signal being an inverse signal to the first input signal;
 a first transistor coupled between the first power terminal and the first output node and having a gate terminal coupled to the second output node;
 a second transistor coupled between the first output node and the ground terminal and having a gate terminal coupled to the first input terminal;

a third transistor coupled between the first output node and the first power terminal and having a gate terminal coupled to the second input terminal;

a fourth transistor coupled between the first power terminal and the second output node and having a gate terminal coupled to the first output node;

a fifth transistor coupled between the second output node and the ground terminal and having a gate terminal coupled to the second input terminal; and a sixth transistor coupled between the second output node and the first power terminal and having a gate terminal coupled to the first input terminal.

8. The level shifter circuit of claim 7, wherein the first voltage level is higher than the second voltage level.

9. The level shifter circuit of claim 7, wherein the first and fourth transistors are P-channel transistors and the second, third, fifth, and sixth transistors are N-channel transistors.

10. The level shifter circuit of claim 9, wherein:

the level shifter circuit further comprises an inverter coupled between the first and second input terminals and further coupled to provide one of the first and second input signals, the inverter including transistors; and the first through sixth transistors comprise a thicker oxide than the transistors included in the inverter.

11. The level shifter circuit of claim 9, further comprising a seventh transistor, the seventh transistor being an N-channel transistor coupled between the third transistor and the first power terminal, and further coupled between the sixth transistor and the first power terminal, the seventh transistor having a gate terminal coupled to the first power terminal.

12. The level shifter circuit of claim 11, wherein:

the level shifter circuit further comprises an inverter coupled between the first and second input terminals and further coupled to provide one of the first and second input signals, the inverter including transistors;

the first, second, fourth, and fifth transistors comprise a thicker oxide;

the transistors included in the inverter comprise a thinner oxide; and the third, sixth, and seventh transistors comprise the thicker oxide.

13. The level shifter circuit of claim 11, wherein:

the level shifter circuit further comprises an inverter coupled between the first and second input terminals and further coupled to provide one of the first and second input signals, the inverter including transistors;

the first, second, fourth, and fifth transistors comprise a thicker oxide;

the transistors included in the inverter comprise a thinner oxide; and the third, sixth, and seventh transistors comprise the thinner oxide.

14. The level shifter circuit of claim 7, further comprising:

a second power terminal coupled to supply the second voltage level;

a first additional transistor coupled in series with the second transistor between the first output node and the ground terminal and having a gate terminal coupled to the second power terminal; and a second additional transistor coupled in series with the fifth transistor between the second output node and the ground terminal and having a gate terminal coupled to the second power terminal.

15. The level shifter circuit of claim 14, wherein:

the first and fourth transistors are P-channel transistors;

the second, third, fifth, and sixth transistors are N-channel transistors; and the first and second additional transistors are N-channel transistors.

16. A level shifter circuit, comprising:

a first power terminal coupled to supply a first voltage level;

a ground terminal;

first and second output nodes;

first and second internal nodes;

a first input terminal coupled to receive a first input signal having a power high level at a second voltage level;

a second input terminal coupled to receive a second input signal having a power high level at the second voltage level, the second input signal being an inverse signal to the first input signal;

a first transistor coupled between the first power terminal and the first output node and having a gate terminal coupled to the second internal node;

a second transistor coupled between the first output node and the first internal node and having a gate terminal coupled to the first input terminal;

a third transistor coupled between the first internal node and the ground terminal and having a gate terminal coupled to the first input terminal;

a fourth transistor coupled between the first internal node and the first power terminal and having a gate terminal coupled to the second input terminal;

a fifth transistor coupled between the first power terminal and the second output node and having a gate terminal coupled to the first internal node;

a sixth transistor coupled between the second output node and the second internal node and having a gate terminal coupled to the second input terminal;

a seventh transistor coupled between the second internal node and the ground terminal and having a gate terminal coupled to the second input terminal; and an eighth transistor coupled between the second internal node and the first power terminal and having a gate terminal coupled to the first input terminal.

17. The level shifter circuit of claim 16, wherein the first voltage level is higher than the second voltage level.

18. The level shifter circuit of claim 16, wherein the first, second, fifth, and sixth transistors are P-channel transistors and the third, fourth, seventh, and eighth transistors are N-channel transistors.

19. The level shifter circuit of claim 18, wherein:

the level shifter circuit further comprises an inverter coupled between the first and second input terminals and further coupled to provide one of the first and second input signals, the inverter including transistors; and the first through eighth transistors comprise a thicker oxide than the transistors included in the inverter.

20. The level shifter circuit of claim 18, further comprising a ninth transistor, the ninth transistor being an N-channel transistor coupled between the fourth transistor and the first power terminal, and further coupled between the eighth transistor and the first power terminal, the ninth transistor having a gate terminal coupled to the first power terminal.

21. The level shifter circuit of claim 20, wherein:

the level shifter circuit further comprises an inverter coupled between the first and second input terminals and further coupled to provide one of the first and second input signals, the inverter including transistors;

the first, second, third, fifth, sixth, and seventh transistors comprise a thicker oxide;

the transistors included in the inverter comprise a thinner oxide; and the fourth, eighth, and ninth transistors comprise the thicker oxide.

22. The level shifter circuit of claim 20, wherein:

the level shifter circuit further comprises an inverter coupled between the first and second input terminals and further coupled to provide one of the first and second input signals, the inverter including transistors;

the first, second, third, fifth, sixth, and seventh transistors comprise a thicker oxide;

the transistors included in the inverter comprise a thinner oxide; and the fourth, eighth, and ninth transistors comprise the thinner oxide.

23. The level shifter circuit of claim 18, further comprising:

a ninth transistor, the ninth transistor being an N-channel transistor coupled between the first output node and the ground terminal and having a gate terminal coupled to the first input terminal; and a tenth transistor, the tenth transistor being an N-channel transistor coupled between the second output node and the ground terminal and having a gate terminal coupled to the second input terminal.

24. The level shifter circuit of claim 23, further comprising:

a second power terminal coupled to supply the second voltage level;

a first additional transistor coupled in series with the ninth transistor between the first output node and the ground terminal and having a gate terminal coupled to the second power terminal;

a second additional transistor coupled in series with the third transistor between the first internal node and the ground terminal and having a gate terminal coupled to the second power terminal;

a third additional transistor coupled in series with the seventh transistor between the second internal node and the ground terminal and having a gate terminal coupled to the second power terminal; and a fourth additional transistor coupled in series with the tenth transistor between the second output node and the ground terminal and having a gate terminal coupled to the second power terminal.

25. The level shifter circuit of claim 24, wherein the first, second, third, and fourth additional transistors are N-channel transistors.

26. The level shifter circuit of claim 16, further comprising:

a second power terminal coupled to supply the second voltage level;

a first additional transistor coupled in series with the third transistor between the first internal node and the ground terminal and having a gate terminal coupled to the second power terminal; and a second additional transistor coupled in series with the seventh transistor between the second internal node and the ground terminal and having a gate terminal coupled to the second power terminal.

27. The level shifter circuit of claim 26, wherein:

the first, second, fifth, and sixth transistors are P-channel transistors;

the third, fourth, seventh, and eighth transistors are N-channel transistors; and the first and second additional transistors are N-channel transistors.

28. A level shifter circuit, comprising:

a first power terminal coupled to supply a first voltage level;

a ground terminal;

first and second output nodes;

first and second internal nodes;

a first input terminal coupled to receive a first input signal having a power high level at a second voltage level;

a second input terminal coupled to receive a second input signal having a power high level at the second voltage level, the second input signal being an inverse signal to the first input signal;

a first transistor coupled between the first power terminal and the first output node and having a gate terminal coupled to the second internal node;

a second transistor coupled between the first output node and the first internal node and having a gate terminal coupled to the first input terminal;

a third transistor coupled between the first internal node and the ground terminal and having a gate terminal coupled to the first input terminal;

a fourth transistor coupled between the first internal node and the first power terminal and having a gate terminal coupled to the second output node;

a fifth transistor coupled between the first power terminal and the second output node and having a gate terminal coupled to the first internal node;

a sixth transistor coupled between the second output node and the second internal node and having a gate terminal coupled to the second input terminal;

a seventh transistor coupled between the second internal node and the ground terminal and having a gate terminal coupled to the second input terminal; and an eighth transistor coupled between the second internal node and the first power terminal and having a gate terminal coupled to the first output node.

29. The level shifter circuit of claim 28, wherein the first voltage level is higher than the second voltage level.

30. The level shifter circuit of claim 28, wherein the first, second, fourth, fifth, sixth, and eighth transistors are P-channel transistors and the third and seventh transistors are N-channel transistors.

31. The level shifter circuit of claim 30, wherein:

the level shifter circuit further comprises an inverter coupled between the first and second input terminals and further coupled to provide one of the first and second input signals, the inverter including transistors; and the first through eighth transistors comprise a thicker oxide than the transistors included in the inverter.

32. The level shifter circuit of claim 30, further comprising:

a ninth transistor, the ninth transistor being an N-channel transistor coupled between the first output node and the ground terminal and having a gate terminal coupled to the first input terminal; and a tenth transistor, the tenth transistor being an N-channel transistor coupled between the second output node and the ground terminal and having a gate terminal coupled to the second input terminal.

33. The level shifter circuit of claim 32, further comprising:
a second power terminal coupled to supply the second voltage level;
a first additional transistor coupled in series with the ninth transistor between the first output node and the ground terminal and having a gate terminal coupled to the second power terminal;
a second additional transistor coupled in series with the third transistor between the first internal node and the ground terminal and having a gate terminal coupled to the second power terminal;
a third additional transistor coupled in series with the seventh transistor between the second internal node and the ground terminal and having a gate terminal coupled to the second power terminal; and
a fourth additional transistor coupled in series with the tenth transistor between the second output node and the ground terminal and having a gate terminal coupled to the second power terminal.

34. The level shifter circuit of claim 33, wherein the first, second, third, and fourth additional transistors are N-channel transistors.

35. The level shifter circuit of claim 28, further comprising:
a second power terminal coupled to supply the second voltage level;
a first additional transistor coupled in series with the third transistor between the first internal node and the ground terminal and having a gate terminal coupled to the second power terminal; and
a second additional transistor coupled in series with the seventh transistor between the second internal node and the ground terminal and having a gate terminal coupled to the second power terminal.

36. The level shifter circuit of claim 35, wherein:
the first, second, fourth, fifth, sixth, and eighth transistors are P-channel transistors;
the third and seventh transistors are N-channel transistors; and
the first and second additional transistors are N-channel transistors.

37. A level shifter circuit, comprising:
a first power terminal coupled to supply a first voltage level;
a second power terminal coupled to supply a second voltage level;
a ground terminal;
first and second output nodes;
a first input terminal coupled to receive a first input signal having a power high level at the second voltage level;
a second input terminal coupled to receive a second input signal having a power high level at the second voltage level, the second input signal being an inverse signal to the first input signal;
a first transistor coupled between the first power terminal and the first output node and having a gate terminal coupled to the second output node;
second and third transistors coupled in series between the first output node and the ground terminal, the second transistor having a gate terminal coupled to the first input terminal and the third transistor having a gate terminal coupled to the second power terminal;
a fourth transistor coupled between the first power terminal and the second output node and having a gate terminal coupled to the first output node; and
fifth and sixth transistors coupled in series between the second output node and the ground terminal, the fifth transistor having a gate terminal coupled to the second input terminal and the sixth transistor having a gate terminal coupled to the second power terminal.

38. The level shifter circuit of claim 37, wherein the first voltage level is higher than the second voltage level.

39. The level shifter circuit of claim 37, wherein the first and fourth transistors are P-channel transistors and the second, third, fifth, and sixth transistors are N-channel transistors.

40. The level shifter circuit of claim 37, wherein:
the level shifter circuit further comprises an inverter coupled between the first and second input terminals and further coupled to provide one of the first and second input signals, the inverter including transistors; and
the first through sixth transistors comprise a thicker oxide than the transistors included in the inverter.

41. A level shifter circuit, comprising:
a first power terminal coupled to supply a first voltage level;
a second power terminal coupled to supply a second voltage level;
a ground terminal;
first and second output nodes;
first and second internal nodes;
a first input terminal coupled to receive a first input signal having a power high level at the second voltage level;
a second input terminal coupled to receive a second input signal having a power high level at the second voltage level, the second input signal being an inverse signal to the first input signal;
a first transistor coupled between the first power terminal and the first output node and having a gate terminal coupled to the second internal node;
a second transistor coupled between the first output node and the first internal node and having a gate terminal coupled to the first input terminal;
third and fourth transistors coupled in series between the first internal node and the ground terminal, the third transistor having a gate terminal coupled to the first input terminal and the fourth transistor having a gate terminal coupled to the second power terminal;
a fifth transistor coupled between the first power terminal and the second output node and having a gate terminal coupled to the first internal node;
a sixth transistor coupled between the second output node and the second internal node and having a gate terminal coupled to the second input terminal; and
seventh and eighth transistors coupled in series between the second internal node and the ground terminal, the seventh transistor having a gate terminal coupled to the second input terminal and the eighth transistor having a gate terminal coupled to the second power terminal.

42. The level shifter circuit of claim 41, wherein the first voltage level is higher than the second voltage level.

43. The level shifter circuit of claim 41, wherein the first, second, fifth, and sixth transistors are P-channel transistors and the third, fourth, seventh, and eighth transistors are N-channel transistors.

44. The level shifter circuit of claim 41, wherein:

the level shifter circuit further comprises an inverter coupled between the first and second input terminals and further coupled to provide one of the first and second input signals, the inverter including transistors; and the first through eighth transistors comprise a thicker oxide than the transistors included in the inverter.

* * * * *